United States Patent [19]
Arai et al.

[11] Patent Number: 4,563,654
[45] Date of Patent: Jan. 7, 1986

[54] MOS-TRANSISTOR AMPLIFIER

[75] Inventors: Ikuya Arai; Toshinori Murata, both of Yokohama; Masafumi Kazumi, Tokyo, all of Japan

[73] Assignee: Hitachi, Ltd., Tokyo, Japan

[21] Appl. No.: 581,271

[22] Filed: Feb. 17, 1984

[30] Foreign Application Priority Data

Feb. 18, 1983 [JP] Japan .................................. 58-24558

[51] Int. Cl.[4] ........................... H03F 3/16; H03F 3/45
[52] U.S. Cl. ....................................... 330/277; 330/253
[58] Field of Search ................ 330/253, 264, 269, 277

[56] References Cited
PUBLICATIONS

Black et al., "CMOS Process for High-Performance Analog LSI", International Electron Devices Meeting, Technical Digest, 6-8, Dec. 1976.

Primary Examiner—James B. Mollins
Assistant Examiner—G. Wan
Attorney, Agent, or Firm—Antonelli, Terry & Wands

[57] ABSTRACT

An amplifier circuit using MOS transistors. The load to be connected to an amplifying element of the amplifier circuit is formed by a C-MOS transistor having a P-MOS transistor and an N-MOS transistor.

17 Claims, 16 Drawing Figures

MOS-TRANSISTOR AMPLIFIER

FIELD OF THE INVENTION

This invention relates to an amplifier using MOS transistors (metal oxide semiconductor transistors).

BACKGROUND OF THE INVENTION

Recently, high-density integrated circuits (IC) and large-scale integrated circuits (LSI) which employ MOS transistors to process analog signals have been produced. An LSI having incorporated therein a CCD (charge coupled device) transversal filter for equalizing the waveform of video signal to remove the ghost mixed in a television signal is also one of the MOS analog LSIs. This transversal filter includes a circuit for controlling the gain of an amplifier analog signal to the input signal. The ghost mixed in a television signal has not only the same polarity as a video signal (desired signal) but opposite polarity thereto, and therefore in order to remove the ghost, it is necessary to properly control the gain of the non-inverted or inverted amplified video signal to the input video signal and thus to use two control signals therefor. In order to meet this requirement, an amplifier is necessary which is suited to be integrated and has one input and two outputs, that is, non-inverted and inverted output signals the waveforms of which are the same.

Figure 1:
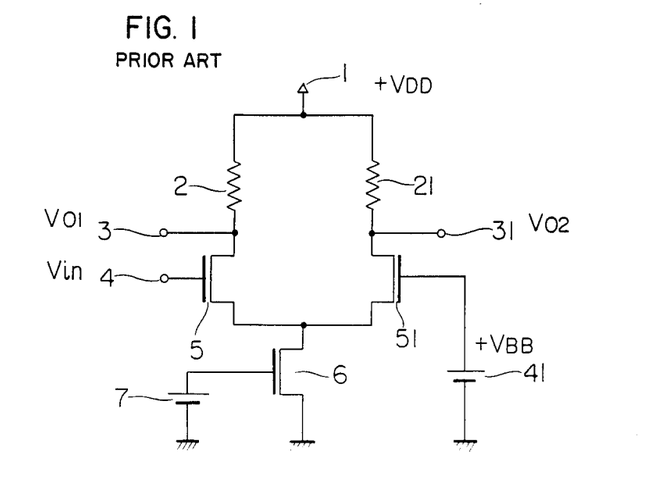
FIG. 1 is a circuit diagram of a conventional differential amplifier with resistors for load.

FIG. 1 is a circuit diagram of a well-known differential amplifier with a load of resistors. There are shown a power supply 1 (voltage = $+V_{DD}$), load resistors 2 and 21, an output terminal 3 at which an inverted signal opposite in phase to an input signal is produced, an output terminal 31 at which a non-inverted signal in phase with the input signal is produced, a signal input terminal 4, a reference biasing source (voltage = $+V_{BB}$) 41, load-drive elements, or N-channel MOS transistors 5 and 51 for amplifying the input signal, an N-MOS transistor 6 for a constant current source, and a gate biasing source 7 for the N-MOS transistor 6. The input terminal 4 is connected to the gate electrode of the N-MOS transistor 5. The anode of the biasing source 7 is connected to the gate electrode of the N-MOS transistor 6 and the anode of the biasing source 41 to the gate electrode of the N-MOS transistor 51.

Figure 2:
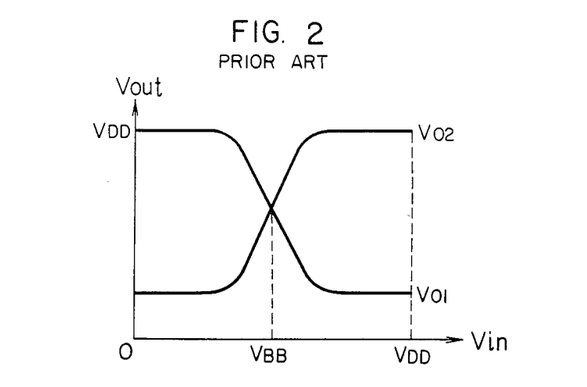
FIG. 2 shows the DC input-output characteristic of the differential amplifier circuit of FIG. 1.

The differential amplifier of FIG. 1 is excellent in the linearity of the amplification factor. To obtain a large voltage gain and to consume small power, it is necessary to select the load resistors to be of large value. Each of the resistors of large values needs a large area on the IC chip, and therefore the area of the chip must be large. Thus, a large-value resistor is not suited to be formed in an IC chip. This situation will be described below. FIG. 2 shows the DC input-output characteristic of the differential amplifier of FIG. 1. The abscissa shows an input voltage $V_{in}$, the ordinate shows an output voltage $V_{out}$, $V_{01}$ is inverted output signal, and $V_{02}$ is a non-inverted output signal. The input voltage $V_{in}$ at the intersection between the inverted and non-inverted outputs $V_{01}$ and $V_{02}$ is the input reference bias voltage ($= +V_{BB}$). The actual usable range of the differential amplifier is the crossing portion with its vicinity of the outputs $V_{01}$ and $V_{02}$, the slopes of which show the gains of the amplifier. Since the magnitudes of the gradients of the outputs $V_{01}$ and $V_{02}$ waveforms are the same and constant, the output signal waveforms are analogous to the input signal waveform, that is, good linearity can be achieved. However, for large voltage gains, the value of the load resistors must be large.

The voltage gain, Av can be expressed by $$Av = \pm G_m R_L \quad (1)$$

where $g_m$ is the mutual conductance of the drive MOS transistors, $R_L$ is the load resistance value, and the plus and minus signs, $\pm$ show non-inverted and inverted outputs, respectively. Since the value of the mutual conductance $g_m$ is substantially constant, depending on the drive MOS transistors used, the value of load resistor $R_L$ must be increased for large gains. Generally to obtain the gains of several dB or above, the load resistance value must be selected to be several KΩ. If the load resistors of such value are formed on an IC chip, a large area is occupied on the chip by the resistors and in addition the actual resistance is deviates greatly from the target value. Therefore, it is difficult to produce circuits having good characteristics, and, hence, large-value resistors are not suited to be used in an IC.

Figure 3:
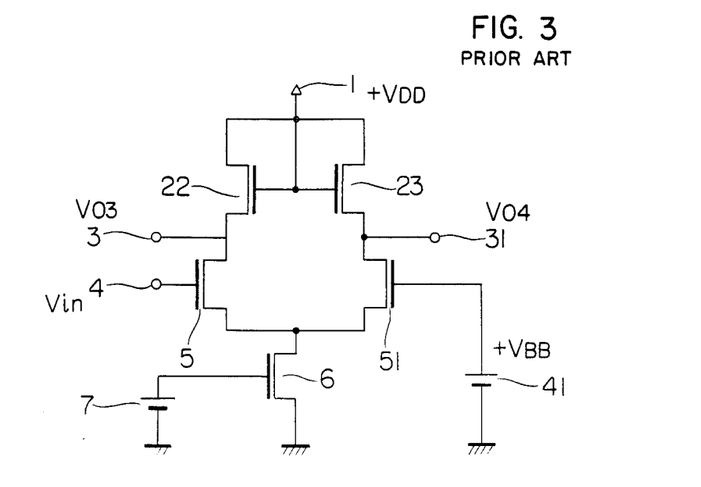
FIG. 3 is a circuit diagram of the differential amplifier with N-MOS transistors for load.

FIG. 3 is a circuit diagram of another differential amplifier using loads of N-MOS transistors instead of the load resistors. In FIG. 3, there are shown N-MOS transistors 22 and 23 for loads. The gate electrodes of the N-MOS transistors 22 and 23 are connected to the power supply 1. The differential amplifier of FIG. 3 can be small-sized because the loads used are not resistors. However, this amplifier has very poor linearity as compared with that of FIG. 1. The reason for this will be described below.

Figure 4:
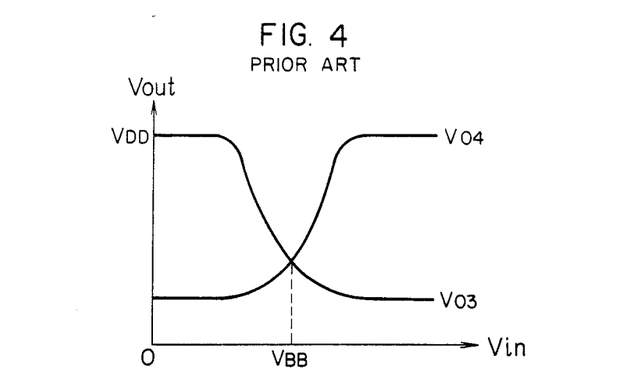
FIG. 4 shows the DC input-output characteristic of the differential amplifier circuit of FIG. 3.

FIG. 4 shows the DC input-output characteristic of the differential amplifier of FIG. 3. The abscissa indicates the input voltage $V_{in}$, the ordinate the output voltage $V_{out}$, $V_{03}$ the inverted output, and $V_{04}$ the non-inverted output. The input voltage at the intersection between the outputs $V_{03}$ and $V_{04}$ corresponds to the input reference bias voltage ($= V_{BB}$). As compared with the characteristic curves of FIG. 2, those of FIG. 4 are unsymmetrical with respect to the line drawn through the crossing in the direction of abscissa. In other words, since the gradients of the output curves $V_{03}$ and $V_{04}$ are not constant, i.e., since the ratio between the input and output voltages is not constant, the linearity is poor.

Figure 5:
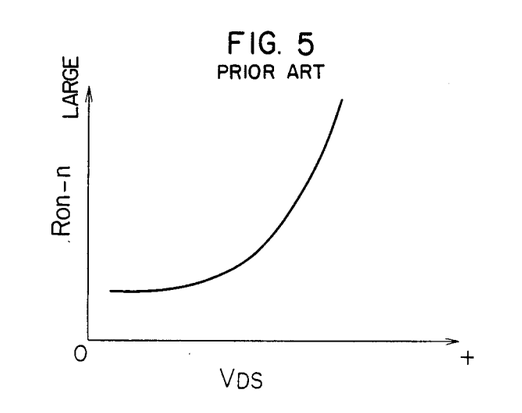
FIG. 5 shows a curve of the on-resistance characteristic of the N-MOS transistor.

FIG. 5 shows a curve of the resistance characteristic of the N-MOS transistors for loads. The abscissa is the voltage $V_{DS}$ between the drain electrode and source electrode of each of the N-MOS transistors, and the ordinate is the on-resistance Ron-n thereof. When a signal is applied to the input of the differential amplifier of FIG. 3, the drain-source voltages of the load-drive MOS transistors 5 and 51 are changed, and as a result the drain-source voltages $V_{DS}$ of the load MOS transistors 22 and 23 are changed. As is apparent from FIG. 5, the on-resistances Ron-n of the load transistors are changed with the change of the drain-source voltages $V_{DS}$. Therefore, the resistances of the load transistors are changed by the value of the input voltage. Consequently, the voltage gain $A_v$ is not constant from Eq. (1), and hence the lineality of the differential amplifier of FIG. 3 is inferior to that of the differential amplifier using the resistance loads in FIG. 1.

SUMMARY OF THE INVENTION

It is an object of this invention to provide an amplifier circuit using MOS transistors which is excellent in its lineality and suited to be incorporated in an integrated circuit.

According to this invention, there is provided a MOS-transistor amplifier of which the load circuit is formed of a C-MOS (complementary MOS) transistor.

BRIEF DESCRIPTION OF THE DRAWINGS

The present invention will be apparent from the following detailed description taken in conjunction with the accompanying drawings, in which.

DETAILED DESCRIPTION OF THE PREFERRED EMBODIMENTS

Figure 6:
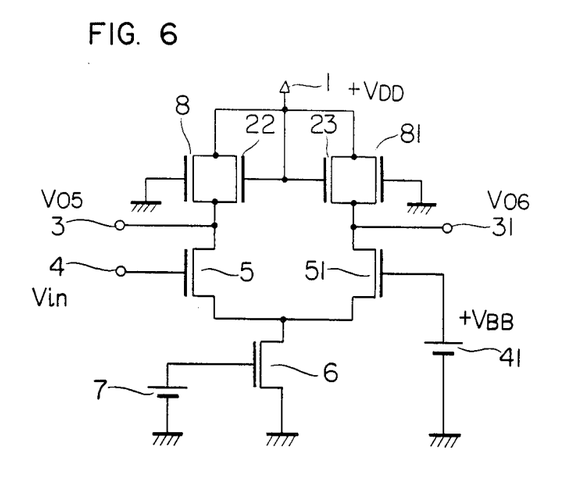
FIG. 6 is a circuit diagram of a differential amplifier with a C-MOS transistor load according to this invention.
Figure 7:
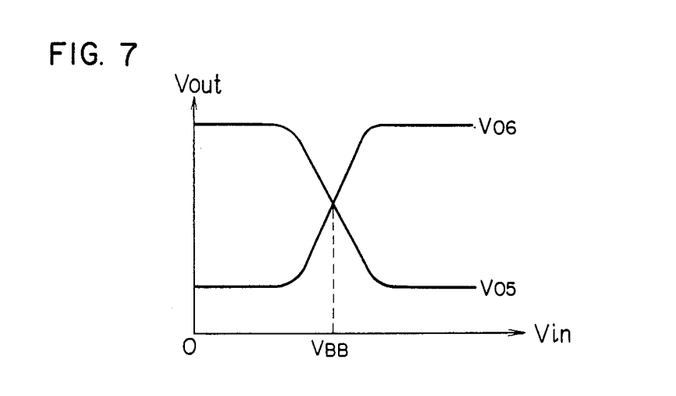
FIG. 7 shows the DC input-output characteristic of FIG. 6.

FIG. 6 is a circuit diagram of one embodiment of this invention. Referring to FIG. 6, there are shown P-MOS (P-channel MOS) transistors 8 and 81 for loads having their source electrodes and drain electrodes connected in parallel to the drain electrodes and source electrodes of N-MOS transistors 22 and 23, respectively, and their gate electrodes connected to a common potential (ground). The P-MOS transistors 8 and 81 for loads and N-MOS transistors 22 and 23 for loads constitute the so-called C-MOS transistors for the loads of a differential amplifier formed of the transistors 5 and 51. FIG. 7 shows curves of the input-output characteristic of the differential amplifier of FIG. 6, in which the abscissa shows the input voltage $V_{in}$, the ordinate the output voltage $V_{out}$, $V_{05}$ the inverted output voltage, and $V_{06}$ the non-inverted output voltage. The characteristic of FIG. 7 is almost the same as that of the conventional differential amplifier with resistance loads shown in FIGS. 1 and 2. The reason for this will be described below.

Figure 8:
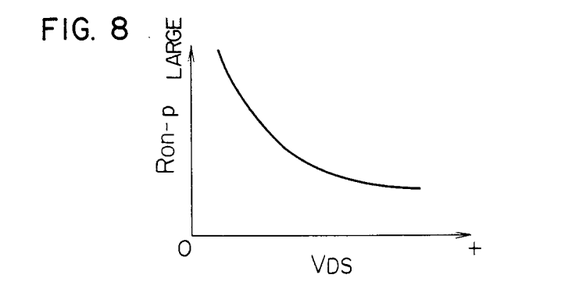
FIG. 8 shows a curve of the on-resistance characteristic of the P-MOS transistor.
Figure 9:
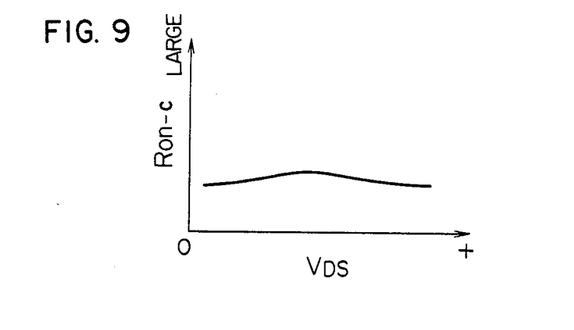
FIG. 9 shows a curve of the on-resistance characteristic of the C-MOS transistor.

When an N-MOS transistor is used as a load, the on-resistance $R_{on-n}$ of the N-MOS transistor is changed by the value of the input signal $V_{in}$. Thus, according to this invention, the P-MOS transistor having the on-resistance characteristic of FIG. 8 is connected in parallel with the load of the N-MOS transistor to form a C-MOS transistor as a load. The on-resistance characteristic of the C-MOS transistor is shown in FIG. 9. From FIG. 9, it will be seen that the value of the on-resistance $R_{on-c}$ of the C-MOS transistor is not much changed, or is substantially constant with the change of the drain-source voltage $V_{DS}$, or the input voltage $V_{in}$. Consequently, the differential amplifier with a C-MOS transistor for load has the same lineality as does the differential amplifier with resistance load.

Figure 10:
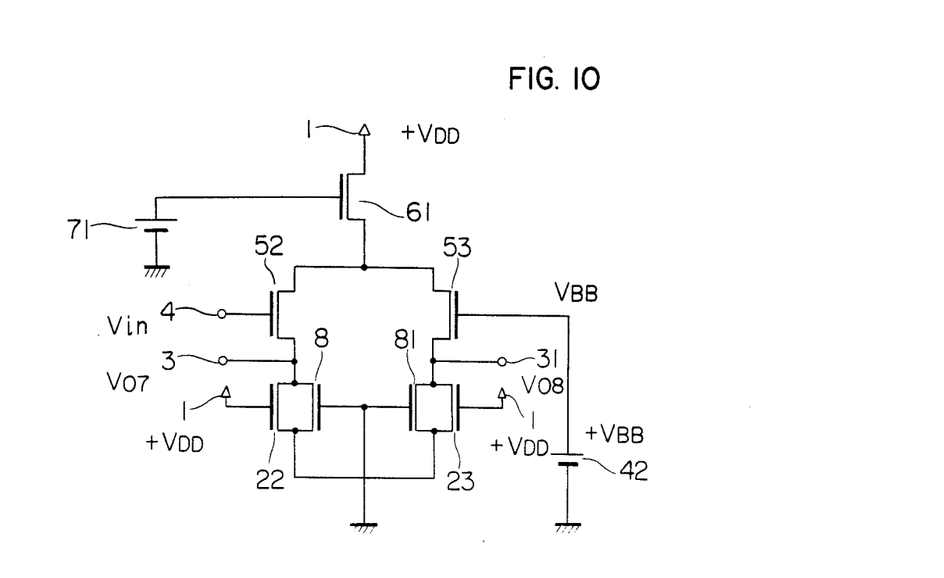
FIG. 10 is a circuit diagram of a differential amplifier having a C-MOS transistor load and P-MOS transistors for the other portion.

FIG. 10 is a circuit diagram of a differential amplifier of another embodiment of the invention in which P-MOS transistors are used for load-driving transistors 52 and 53 and constant current source transistor 61. In FIG. 10, there are shown an input reference biasing source (of $V_{BB}$) 42, the load-driving P-MOS transistors 52 and 53, the P-MOS transistor 61 for constant current source, and a biasing source 71 for the P-MOS transistor 61.

Figure 11:
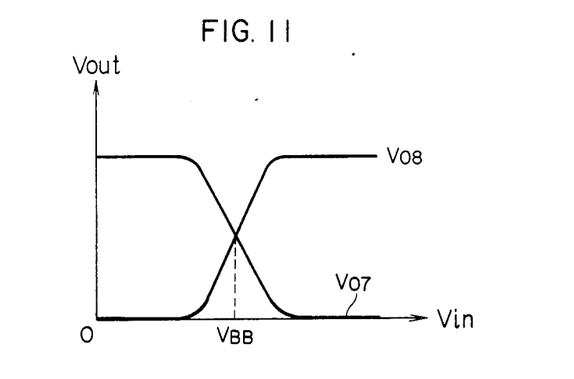
FIG. 11 shows curves of the DC input-output characteristic of the differential amplifier of FIG. 10.

FIG. 11 shows curves of the DC input-output characteristic of the differential amplifier of FIG. 10. The ordinate shows the output voltage $V_{out}$, the abscissa the input voltage $V_{in}$, $V_{07}$ the inverted output, and $V_{08}$ the non-inverted output. Since the differential amplifier of FIG. 10 employs P-MOS transistors opposite in operation to the N-MOS transistor, and for driving the loads and making the constant current source, the DC outputs $V_{out}$ are low but the linearity is the same as that of the differential amplifier of FIG. 6, as shown in FIG. 11. The gains of the differential amplifier of FIG. 10 can be determined by selecting the gates of the C-MOS transistors to be of a proper size. The power consumption thereof is as small as in the differential amplifier of FIG. 6.

Figure 12:
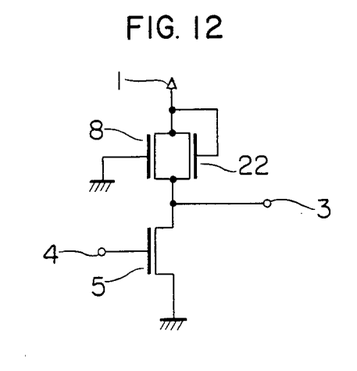
FIG. 12 is a circuit diagram of an inverting amplifier having a C-MOS transistor load and an N-MOS transistor for driving the load.

FIG. 12 shows a single amplifier as still another embodiment of this invention. In FIG. 12, there are shown the power supply 1, N-MOS and P-MOS transistors 22 and 8 as a load circuit, the output terminal 3 at which an inverted output signal is produced, the signal input terminal 4, and the N-MOS transistor 5 as a load-driving element.

Even in the inverting amplifier (inverter) of FIG. 12, the on-resistance $R_{on-c}$ of the C-MOS transistor as a load is constant. Therefore, the linearity of this inverter is substantially the same as that of the amplifier with resistance load, and the resistance values of the C-MOS transistors 8, 22 can be determined by properly selecting the size of the gates of the C-MOS transistor. The resistance value of the C-MOS transistor is increased with a decrease of the gate size, and as a result the power consumption of the circuit is reduced.

Figure 13:
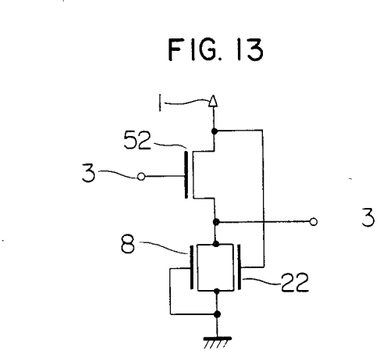
FIG. 13 is a circuit diagram of an inverting amplifier having a C-MOS transistor load and a P-MOS transistor for driving the load.

FIG. 13 is a circuit diagram of an inverting amplifier of a further embodiment in which the P-MOS transistor 52 is used as a load driving transistor.

Also in the inverting amplifier of FIG. 13, since the C-MOS transistor of which the on-resistance is almost constant is used as a load, the linearity is excellent. The value of the load can be increased to a relatively large value by properly decreasing the size of the gates of the C-MOS transistor for the load.

According to this invention, since a C-MOS transistor or C-MOS transistors are used as a load or loads, a relatively large value of load can be obtained in a simple manner and the power consumption can be decreased. In addition, since the load of C-MOS transistor has an almost constant on-resistance, the linearity is substantially the same as that of the circuit with resistance load. Moreover, since the amplifying circuit of this invention is formed by only MOS transistors, this circuit occupies a small space when incorporated in an IC.

Figure 14:
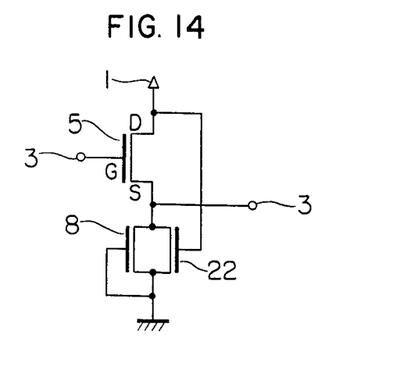
FIGS. 14 and 15 are circuit diagrams of different source followers with C-MOS transistors for loads, respectively.
Figure 15:
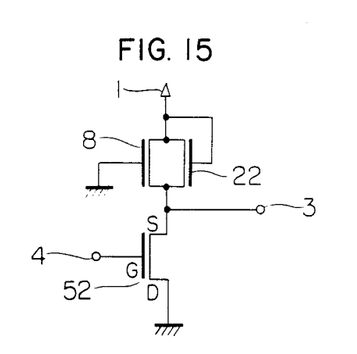

FIGS. 14 and 15 show different transistor amplifiers of source-follower configuration as further embodiments of this invention. In FIG. 14, the C-MOS transistor 8, 22 is connected to the source electrode of the N-MOS transistor 5. In FIG. 15, the C-MOS transistor 8, 22 is connected to the source electrode of the P-MOS transistor 52. The linearity of the current amplification factor in FIGS. 14 and 15 is excellent.

Figure 16:
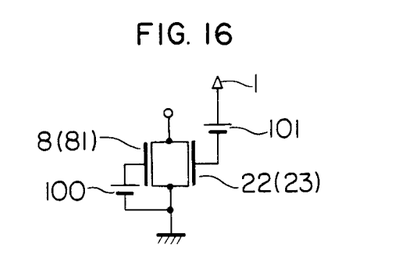
FIG. 16 is a circuit diagram of a bias-voltage supply circuit connected to the gate electrodes of a C-MOS transistor.

FIG. 16 shows a bias-voltage supply circuit for supplying a bias voltage to the gate electrode of the C-MOS transistor. In FIG. 16, a power supply 100 is connected to the gate electrode of the P-MOS transistor 8 (81), and a power supply 101 is connected to the gate electrode of the N-MOS transistor 22 (23). The biasing circuit shown in FIG. 16 can be employed in the circuits of FIGS. 12, 13, 14 and 15.

We claim:

1. An amplifying circuit having a first MOS transistor used as an amplifying element and a second MOS transistor used as a load of said first MOS transistor, a gate electrode of said second MOS transistor being connected to a first predetermined potential for biasing said second MOS transistor, wherein a third MOS transistor is connected in parallel with said second MOS transistor, said third and second MOS transistors being complementary transistors, and a gate electrode of said third MOS transistor is connected to a second predetermined potential for biasing said third MOS transistor.

2. An amplifying circuit according to claim 1, wherein said first MOS transistor is an N-MOS transistor, said second MOS transistor is an N-MOS transistor, said third MOS transistor is a P-MOS transistor, a source electrode of said second MOS transistor is connected to a drain electrode of said first MOS transistor, a drain electrode of said third MOS transistor is connected to the source electrode of said second MOS transistor, and a drain electrode of said second MOS transistor is connected to a source electrode of said third MOS transistor.

3. An amplifying circuit according to claim 2, wherein the gate electrode of said second MOS transistor is connected to a power source, and the gate electrode of said third MOS transistor is connected to a common potential of said amplifying circuit.

4. An amplifying circuit according to claim 1, wherein said first MOS transistor is a P-MOS transistor, said second MOS transistor is a P-MOS transistor, said third MOS transistor is an N-MOS transistor, a source electrode of said second MOS transistor is connected to a drain electrode of said first MOS transistor, a drain electrode of said third MOS transistor is connected to the source electrode of said second MOS transistor and a drain electrode of said second MOS transistor is connected to a source electrode of said third MOS transistor.

5. An amplifying circuit according to claim 4, wherein the gate electrode of said second MOS transistor is connected to a power source, and the gate electrode of said third MOS transistor is connected to a common potential of said amplifying circuit.

6. An amplifying circuit according to claim 1, wherein said first MOS transistor is an N-MOS transistor, said second MOS transistor is an N-MOS transistor, and said third MOS transistor is a P-MOS transistor, a drain electrode of said second MOS transistor is connected to a source electrode of said first MOS transistor, a source electrode of said third MOS transistor is connected to the drain electrode of said second MOS transistor, and a source electrode of said second MOS transistor is connected to a drain electrode of said third MOS transistor.

7. An amplifying circuit according to claim 6, wherein the gate electrode of said second MOS transistor is connected to a power source, and the gate electrode of said third MOS transistor is connected to a common potential of said amplifying circuit.

8. An amplifying circuit according to claim 1, wherein said first MOS transistor is a P-MOS transistor, said second MOS transistor is a P-MOS transistor, said third MOS transistor is an N-MOS transistor, a drain electrode of said second MOS transistor is connected to a source electrode of said first MOS transistor, a source electrode of said third MOS transistor is connected to the drain electrode of said second MOS transistor, and a source electrode of said second MOS transistor is connected to a drain electrode of said third MOS transistor.

9. An amplifying circuit according to claim 8, wherein the gate electrode of said second MOS transistor is connected to a power source, and the gate electrode of said third MOS transistor is connected to a common potential of said amplifying circuit.

10. An amplifying circuit according to claim 1, wherein the gate electrode of said second MOS transistor is connected to a power source, and the gate electrode of said third MOS transistor is connected to a common potential of said amplifying circuit.

11. A differential amplifier circuit having first and second MOS transistors of which the source electrodes are connected to each other, and a third MOS transistor of which a drain electrode is connected to the source electrodes of said first and second MOS transistors, wherein a C-MOS transistor formed by a fourth MOS transistor of N-type and a fifth MOS transistor of P-type which are connected in parallel, is connected to the drain electrode of said first MOS transistor as a load of said first MOS transistor, and a C-MOS transistor formed by a sixth MOS transistor of N-type and a seventh MOS transistor of P-type which are connected in parallel, are connected to the drain electrode of said second MOS transistor as a load of said second MOS transistor.

12. A differential amplifier circuit according to claim 11, wherein said first, second and third transistors are each formed of an N-type MOS transistor.

13. A differential amplifier circuit according to claim 12, wherein the gate electrodes of said fourth and sixth MOS transistors and connected to a power source and the gate electrodes of said fifth and seventh MOS transistors are connected to a common potential of said differential amplifier circuit.

14. A differential amplifier circuit according to claim 11, wherein said first, second and third MOS transistors are each formed of a P-type transistor.

15. A differential amplifier circuit according to claim 14, wherein the gate electrodes of said fourth and sixth MOS transistors are connected to a power source and the gate electrodes of said fifth and seventh MOS transistors are connected to a common potential of said differential amplifier circuit.

16. A differential amplifier circuit according to claim 11, wherein the gate electrodes of said fourth and sixth MOS transistors are connected to a power source, and the gate electrodes of said fifth and seventh MOS transistors are connected to a common potential of said differential amplifier circuit.

17. An amplifying circuit comprising:
a first MOS transistor used as an amplifying element for an input signal $V_{in}$ applied to a gate of said first MOS transistor to provide an amplified output signal to an output terminal coupled to a drain-source path of said first MOS transistor;
a C-MOS transistor coupled in series with the source-drain path of said first MOS transistor and used as a load of said first MOS transistor, said C-MOS transistor comprising a second MOS transistor of P-type and a third MOS transistor of N-type coupled in parallel with said second MOS transistor, a gate electrode of said second MOS transistor being connected to a first predetermined potential for biasing said second MOS transistor, and a gate electrode of said third MOS transistor being connected to a second predetermined potential for biasing said third MOS transistor so that said C-MOS transistor will have an on-resistance Ron-c which is substantially constant in response to changes of said input signal $V_{in}$.

* * * * *